(12) United States Patent
Buck et al.

(10) Patent No.: US 6,188,213 B1
(45) Date of Patent: Feb. 13, 2001

(54) ELECTRONIC, PREFERABLY PROXIMITY-TYPE, SWITCHING DEVICE

(75) Inventors: Robert Buck, Wasserburg; Reinhard Teichmann, Amtzell, both of (DE)

(73) Assignee: i f m electronic GmbH, Essen (DE)

( * ) Notice: Under 35 U.S.C. 154(b), the term of this patent shall be extended for 0 days.

(21) Appl. No.: 09/503,742

(22) Filed: Feb. 15, 2000

(30) Foreign Application Priority Data

Feb. 16, 1999 (DE) .............................................. 199 06 342

(51) Int. Cl.⁷ .................................. G05F 1/40; H02J 3/12
(52) U.S. Cl. ........................... 323/282; 323/284; 323/351
(58) Field of Search .................................. 323/284, 282, 323/351

(56) References Cited

U.S. PATENT DOCUMENTS

| 3,579,090 | * | 5/1971 | Madsen ................................. 323/284 |
| 4,529,927 | * | 7/1985 | O'Sullivan et al. .................. 323/222 |
| 4,814,966 | * | 3/1989 | Ekstrand ................................. 363/89 |
| 5,861,737 | * | 1/1999 | Goerke et al. ....................... 323/282 |
| 6,034,516 | * | 3/2000 | Goerke et al. ....................... 323/282 |

FOREIGN PATENT DOCUMENTS

| 19 51 137 | 5/1971 | (DE) | ............................... H03B/5/12 |
| 21 27 956 | 12/1972 | (DE) | .............................. H03K/17/00 |
| 23 30 233 | 1/1975 | (DE) | .............................. H03K/17/00 |
| 26 13 423 | 10/1977 | (DE) | .............................. H03K/17/00 |
| 27 11 877 | 9/1978 | (DE) | .............................. H03K/17/00 |
| 28 08 156 | 9/1979 | (DE) | ............................. H03K/17/945 |
| 29 22 309 | 12/1980 | (DE) | .............................. H03K/17/13 |
| 33 20 975 | 12/1984 | (DE) | .............................. H03K/17/94 |
| 42 09 396 | 9/1993 | (DE) | ............................. H03K/17/945 |

* cited by examiner

Primary Examiner—Peter S. Wong
Assistant Examiner—Bao Q. Vu
(74) Attorney, Agent, or Firm—Nixon Peabody LLP; David S. Safran

(57) ABSTRACT

An electronic, proximity-type switching device with a first switching device terminal (1), a second switching device terminal (2), a sensor and evaluation circuit (3) which contains an externally influenceable proximity indicator and an operating voltage supply circuit for making available the internally required operating voltage (= internal operating voltage) and with an electronic switch (4) which is controllable by the sensor and evaluation circuit (3), for example, a switching transistor, the sensor and evaluation circuit (3), on the one hand, and the electronic switch (4), on the other, being connected essentially in parallel and to the first switching device terminal (1) and the second switching device terminal (2). To enable the switching device to be used as a normal 2-wire switching device and also as a 3-wire switching device, there is a third switching device terminal (5) and there are a current rise (6) which is active in the conductive state of the switching device and/or a voltage drop or limitation (7) which is active in the blocked state of the switching device between the second switching device terminal (2) and the third switching device terminal (5).

15 Claims, 4 Drawing Sheets

ELECTRONIC, PREFERABLY PROXIMITY-TYPE, SWITCHING DEVICE

BACKGROUND OF THE INVENTION

1. Field of the Invention

The invention relates to an electronic, preferably proximity-type, switching device, with a first switching device terminal, with a second switching device terminal, with a sensor and an evaluation circuit which contains a proximity indicator which can be externally influenced, an operating voltage supply circuit for making available the required internal operating voltage, and with an electronic switch which can be controlled by the sensor and evaluation circuit, for example, a switching transistor, the sensor and evaluation circuit, on the one hand, and the electronic switch, on the other, being connected essentially in parallel and to the first switching device terminal and the second switching device terminal.

2. Description of Related Art

The switching device underlying the invention has a first switching device terminal and a second switching device terminal; therefore, it is a so-called 2-wire switching device. In one such 2-wire switching device, the power supply voltage (= external operating voltage) must be connected to one switching device terminal, while a load can be connected to the other switching device terminal; then, the power supply voltage can be connected to the load. In the switched-through state, then, the load current flows from one pole of the power supply voltage via the switching device, primarily via the conductively controlled electronic switch, and via the load to the other pole of the power supply voltage (or vice versa).

The sensor and evaluation circuit implemented in the switching device of the type under consideration can be made entirely differently; it is almost irrelevant to the teaching of the invention how it is done. This also applies to the execution of the proximity indicator and to the execution of the operating voltage supply circuit. Conventionally, part of the proximity indicator, at least part of the operating voltage supply circuit and at least part of what otherwise belongs to the sensor and evaluation circuit are implemented in an IC (integrated circuit). But this need not necessarily be the case. In the electronic switching device under consideration, even if it is no longer conventional at present, the sensor and evaluation circuit can be built completely from discrete components.

Finally, with reference to the electronic switching device underlying the invention, it was stated at the beginning that the sensor and evaluation circuit, on the one hand, and the electronic switch, on the other, are connected at least essentially in parallel and to the first switching device terminal and the second switching device terminal. "Connected at least essentially in parallel" means that the switching device, with reference to the switching device terminals, has essentially two current paths, specifically, one current path via the sensor and evaluation circuit, and the other current path via the electronic switch. Consequently, the description "connected at least essentially in parallel" also includes an embodiment in which, for example, in series to the electronic switch, there is a Zener diode or polarity reversal protection diode or a short circuit detection resistor, this series connection being parallel to the sensor and evaluation circuit.

Electronic switching devices of the above described type are made without contacts, and for more than twenty years have been increasingly used instead of electrical, mechanically operated switching devices, which are made with contacts, especially in electrical and electronic measurement and control circuits. This applies especially to proximity switches, i.e., for electronic switching devices which work by proximity. With these switching devices, it is indicated whether an influencing element to which the corresponding proximity switch is sensitive has approached the proximity switch closely enough. Specifically, if an influencing element to which the proximity switch is sensitive has approached the proximity switch near enough, the proximity indicator of the electronic switch reverses; in a switching device which is made as a make contact, the electronic switch which was first nonconductive becomes conductive, while in a switching device made as a break contact, the electronic switch which was initially conductive now blocks. (With switching devices of the type under consideration, it can also be indicated whether a physical quantity of an influencing medium to which the switching device is sensitive has reached a corresponding value.)

In electronic switching devices which can be connected via an outer lead to one pole of a power supply voltage, and only via another outer lead to one terminal of a load, i.e., in 2-wire switching devices, it is not easy to make available the internally required operating voltage (= internal operating voltage) or the required operating current because the internal operating voltage or operating current must be made available both in the conductive state and also in the blocked state of the switching device.

It is trivial whether making available an internal operating voltage or operating current is involved, because internally, especially for the proximity indicator and other circuit parts of the sensor and evaluation circuit, electric power is of course needed; therefore, both an internal operating voltage and also an operating current are required (compare the detailed description of this matter in published German Patent Application No. 23 30 233, especially column 5, line 68, to column 6, line 33).

In terms of their function as switching devices, in 2-wire switching devices, in the conductive state, almost no voltage drop will occur, and in the blocked state, almost no current will flow. But, since if no voltage drop were to occur in the 2-wire switching devices in the conductive state, no internal operating voltage could be obtained, and if in the blocked state no current were to flow, no operating current could be obtained, it applies to all electronic switching devices with only two outer wires that, in the conductive state a voltage drop occurs, and in the blocked state a residual current flows.

It follows then from what has been explained above that, if a voltage drop occurs in the conductive state in electronic 2-wire switching devices, unwantedly, but necessary for operation, and in the blocked state, a residual current flows, the voltage drop and the residual current should be as small as possible. The problem area "reduction of the voltage drop in the conductive state of the switching device" has already been treated in detail in the published German Patent Applications and Patents, Nos. 19 51 137; 21 27 956; 26 13 423; 27 11 877; 28 08 156; 29 22 309;and 33 20 975.

Otherwise, in addition to the 2-wire switching devices explained above, 3-wire switching devices are also known; therefore, electronic switching devices which have three switching device terminals. In these switching devices, the power supply voltage can be connected to two switching device terminals, while the load, to which, otherwise, the power supply voltage can be connected, can be connected to the third switching device terminal. In the 3-wire switching devices which are made as direct current devices, therefore, in 3-wire DC switching devices, it is distinguished between those which are plus-switching, and those which are minus-switching, depending on whether the third switching device terminal, and thus the load connected thereto, are switched through via the electronic switch to the switching device terminal which carries the plus potential of the power supply voltage, or the switching device terminal which carries the minus potential of the power supply voltage. There are also 4-wire DC switching devices which have a switching device terminal which is switched through by an electronic switch to the switching device terminal which carries the plus potential of the power supply voltage, and which have another switching device terminal which is switched through by another electronic switch to the switching device terminal which carries the minus potential of the power supply voltage. These 4-wire DC switching devices can, therefore, be used selectively as plus-switching or minus-switching, depending on to which of the two switching device terminals provided for this purpose the load is connected. However, there are also 3-wire DC switching devices which can be used selectively as plus-switching or minus-switching, and which can, therefore, be programmed accordingly.

But, 2-wire switching devices, as compared to 3-wire switching devices, of course, have not only the above described system-induced defects that, in the conductive state, a voltage drop occurs, and in the blocked state, a residual current flows, they also have the system-induced advantage that only two lines need be installed and connected. Nonetheless, 3-wire switching devices are used extensively, specifically when the system-induced defects of 2-wire switching devices, the voltage drop in the conductive state and residual current in the blocked state, cannot be accepted.

It was stated at the start that, in 2-wire switching devices, the sensor and evaluation circuit, on the one hand, and the electronic switch, on the other, are connected at least essentially in parallel. Conversely, it applies to 3-wire switching devices that the sensor and evaluation circuit, on the one hand, and the series connection of the electronic switch and the load on the, other hand, are connected in parallel. In both cases, for the sensor and evaluation circuit, a certain minimum voltage must be available, specially roughly 2.5 V. On the one hand, this minimum voltage in 2-wire switching devices determines the voltage drop which must occur in the conductive state of the switching device. On the other hand, this minimum voltage stipulates the minimum power supply voltage in the 3-wire switching devices.

In the meantime, it has been possible to implement 2-wire switching devices also in a polarized version, which in the conductive state have only a voltage drop of roughly 2.5 V (compare in this respect the contents of unpublished German Patent Application 199 05 170) Consequently, these 2-wire switching devices can now also be used where, to date, 2-wire switching devices due to the functionally-necessary voltage drop in the conductive state could not be used, rather 3-wire switching devices have been used. This applies especially to use of those switching devices in conjunction with system-programmable controls (SPS). The SPS standard calls for a residual voltage of 5 V as the maximum value, but in fact, a residual voltage of roughly 2.5 V is required.

If the voltage drop of the 2-wire switching devices in the conductive state is no longer an obstacle to the inherently desirable use of 2-wire switching devices, there still remains a barrier to the inherently desirable use of 2-wire switching devices where so far 3-wire switching devices have been used. Specifically, in the conductive state, the 2-wire switching devices require a load current of at least 5 mA, otherwise, as explained initially, in the blocked state, they require a residual current which is currently at least roughly 0.5 mA.

SUMMARY OF THE INVENTION

The primary object of the present invention is to provide a completely new switching device which, first of all, is a 2-wire switching device, and can always be used as a 2-wire switching device when the system-induced defects of 2-wire switching devices are not an obstacle to the use of these switching devices, but which, however, then can be used as a 3-wire switching device when it cannot be used as a 2-wire switching device.

The switching device in accordance with the invention in which the aforementioned object is achieved, first of all, is essentially characterized by the fact that there is a third switching device terminal and that between the second switching device terminal and the third switching device terminal there is a current rise which is active in the conductive state of the switching device and/or a voltage drop or limitation which is active in the blocked state of the switching device.

The switching device according to the invention is a conventional 2-wire switching device in which the sensor and evaluation circuit, on the one hand, and the electronic switch, on the other, are connected at least essentially in parallel and to the first switching device output and the second switching device output. Consequently, in the conductive state, the load current flows from the first switching device terminal to the second switching device terminal (or vice vera) and to a generally small part, specifically, only to the functionally necessary part via the sensor and evaluation circuit, otherwise, via the electronic switch. If, at this point, there were simply only a third switching device terminal and the power supply voltage were applied to the first switching device terminal and to the third switching device terminal and the load were connected to the second switching device terminal and the third switching device terminal, the load would, so to speak, be functionally integrated into the switching device, but nothing would be gained as compared to the connection which is conventional in 2-wire switching devices, because as before, in the conductive state, a minimum load current of at least roughly 5 mA, and in the blocked state, a residual current of at least roughly 0.5 mA, would have to flow via the load.

As explained above, in accordance with the invention, between the second switching device terminal and the third switching device terminal, there is a current rise which is active in the conductive state of the switching device, or a voltage drop or limitation which is active in the blocked state of the switching device, and between the second switching device terminal and the third switching device terminal, there is a current rise which is active in the conductive state of the switching device and a voltage drop or limitation which is active in the blocked state of the switching device. Generally, there are both a current rise and a voltage reduction or limitation; this case will be examined below.

The current rise which is present according to the invention and which is active in the conductive state of the switching device, represents a parallel path to the load starting from the second switching device terminal for the residual current flowing from the first switching device terminal via the sensor and evaluation circuit on the one hand and via the electronic switch on the other to the second switching device terminal. Therefore, it is no longer necessary for the operating current required by the sensor and evaluation circuit in the conductive state of the switching device to flow as a minimum load current via the load.

The voltage drop or limitation which is provided in accordance with the invention and which is active in the blocked state of the switching device represents a parallel path to the load starting from the second switching device terminal for the residual current flowing from the first switching device terminal via the sensor and evaluation circuit to the second switching device terminal. Therefore, it is no longer necessary for the residual current needed by the sensor and evaluation circuit to flow via the load.

The expression "current rise" has therefore been chosen here because, with the measure which was designated the current rise, the current which flows via the parallel connection of the sensor and evaluation circuit, on the one hand, and the electronic switch, on the other, is increased relative to the current which would flow if the "current rise" measure were not implemented. The expression "voltage reduction or limitation" was chosen because a reduction or limitation of the voltage between the second switching device terminal and the third switching device terminal, therefore, a reduction or limitation of the potential on the second switching device terminal, leads to the desired result that the residual current which is necessary in the blocked state of the switching device and which flows via the sensor and evaluation circuit, flows only to a small extent or not at all via the load.

In the electronic switching device according to the invention, a resistor can be used in the simplest case as the current rise for the purpose explained in particular above. However, it is more advantageous to provide a constant current source as the current rise. The current specified by the constant current source can be exactly the current which is required by the sensor and evaluation circuit in the conductive state of the switching device as the operating current. Then, a load current which flows via the load is not necessary at all for the operability of the switching device of the invention in the conductive state, the switching device can therefore also operate, and via the proximity indicator which can be influenced from the outside, can allow the electronic switch to become conductive when a very high resistance load is connected or no load at all is connected.

In the switching device in accordance with the invention, the voltage reduction or limitation can be an electronic switch which is conductive in the conductive state of the switching device. If it is fully tripped, in the blocked state of the switching device, the residual current which is needed by the sensor and the evaluation circuit flows almost exclusively via this electronic switch which is provided as the voltage reduction or limitation; the residual current flowing via the load then proceeds almost to zero.

In one especially preferred embodiment of the electronic switching device according to the invention, between the second switching device terminal and the third switching device terminal there is a constant current source which is active both as a current rise and also as a voltage reduction or limitation.

Constant current sources of the type under consideration here are passive circuits which lead to the current flowing through them being constant, in spite of different voltages. A constant current wanted by a constant current source, of course, presupposes that the circuit in which the constant current source is located allows the desired constant current at all. Constant current sources of the type under consideration here can therefore also be understood as current limitation circuits via which a certain current flows which is stipulated by the entire circuit and the voltage acting in it and which, however, is limited to the stipulated constant current. If this is taken into account, the constant current source can be designed overall such that, in the conductive state of the switching device, the operating current required by the sensor and evaluation circuit flows as a constant current via the constant current source, nevertheless in the blocked state of the switching device only the residual current which flows via the sensor and evaluation circuit flows via the constant current source. With a constant current source designed accordingly, in the conductive state of the switching device, the operating current required by the sensor and evaluation circuit cannot flow via the load, and in the blocked state of the switching device, the residual current required by the sensor and evaluation circuit cannot flow via the load. Consequently, in the conductive state of the switching device, a load current which is much less than the operating current required by the sensor and evaluation circuit can flow via the load, and in the blocked state of the switching device, almost no residual current flows via the load.

What has been stated above in conjunction with a constant current source for the current rise and for the voltage reduction or limitation can be achieved without the need for a controlling intervention by the sensor and evaluation circuit.

Constant current sources are often made as current balancing circuits. In the prior art there are those without feedback between the two balancing transistors and those with feedback between the two balancing transistors. For the switching device of the invention, a constant current source is recommended as the current balancing circuit for feedback between the balancing transistors.

Electronic switching devices of the type under consideration here are generally made polarized, i.e., they have at least one polarity reversal protection diode. This leads to an additional voltage drop occurring, of course unwanted, on the polarity reversal protection diode in the switched-through state of the switching device in which, actually, a voltage drop should not occur. One such additional voltage drop is also equally important to an increase in the power loss. The aforementioned applies regardless of the type of switching device both to 2-wire and also 3-wire switching devices and both to AC switching devices and DC switching devices.

Unpublished German Patent Application 199 05 170 extensively treats the problem of achieving a voltage drop as small as possible in the switched-through state of the switching device in a polarized switching device. To do this, it is provided that one inversely operated bipolar transistor be connected in series to a switching device terminal as the polarization element. Inverse operation of the bipolar transistor means that, to control the bipolar transistor, not its base-emitter section or its emitter-base section, but its base-collector section or its collector-base section is used. For an inversely operated pnp transistor, it holds that, in the switched-through state, specifically in saturation operation, a very small voltage drop occurs on the collector-emitter section, specifically, on the order of roughly 10 mV to a maximum of 100 mV, and that the emitter-collector blocking voltage and the base-collector blocking voltage, which is on the order of the emitter-collector blocking voltage, are already large enough for the inversely operated bipolar transits to act as a polarity reversal protection element with sufficiently high blocking voltage.

What is disclosed by the noted German Patent Application 199 05 170 can also be done in the electronic switching in accordance with the invention. Consequently, the contents of the German patent disclosure document 199 05 170 is hereby expressly incorporated by reference in this application.

These and further objects, features and advantages of the present invention will become apparent from the following description when taken in connection with the accompanying drawings which, for purposes of illustration only, show several embodiments in accordance with the present invention.

DETAILED DESCRIPTION OF THE INVENTION

Figure 1:
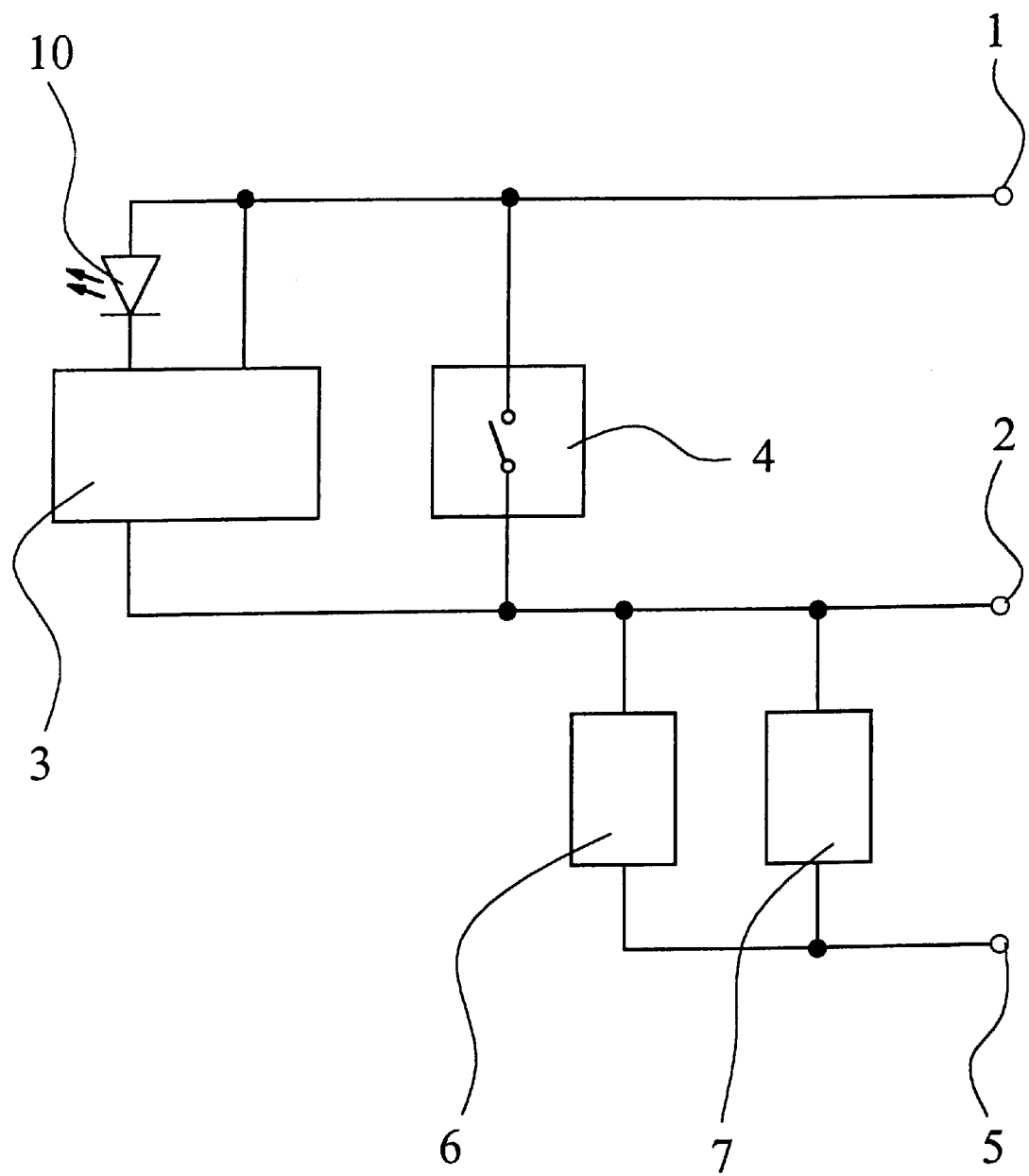
FIG. 1 is a block diagram for explaining the electronic switching device in accordance with the invention.
Figure 2:
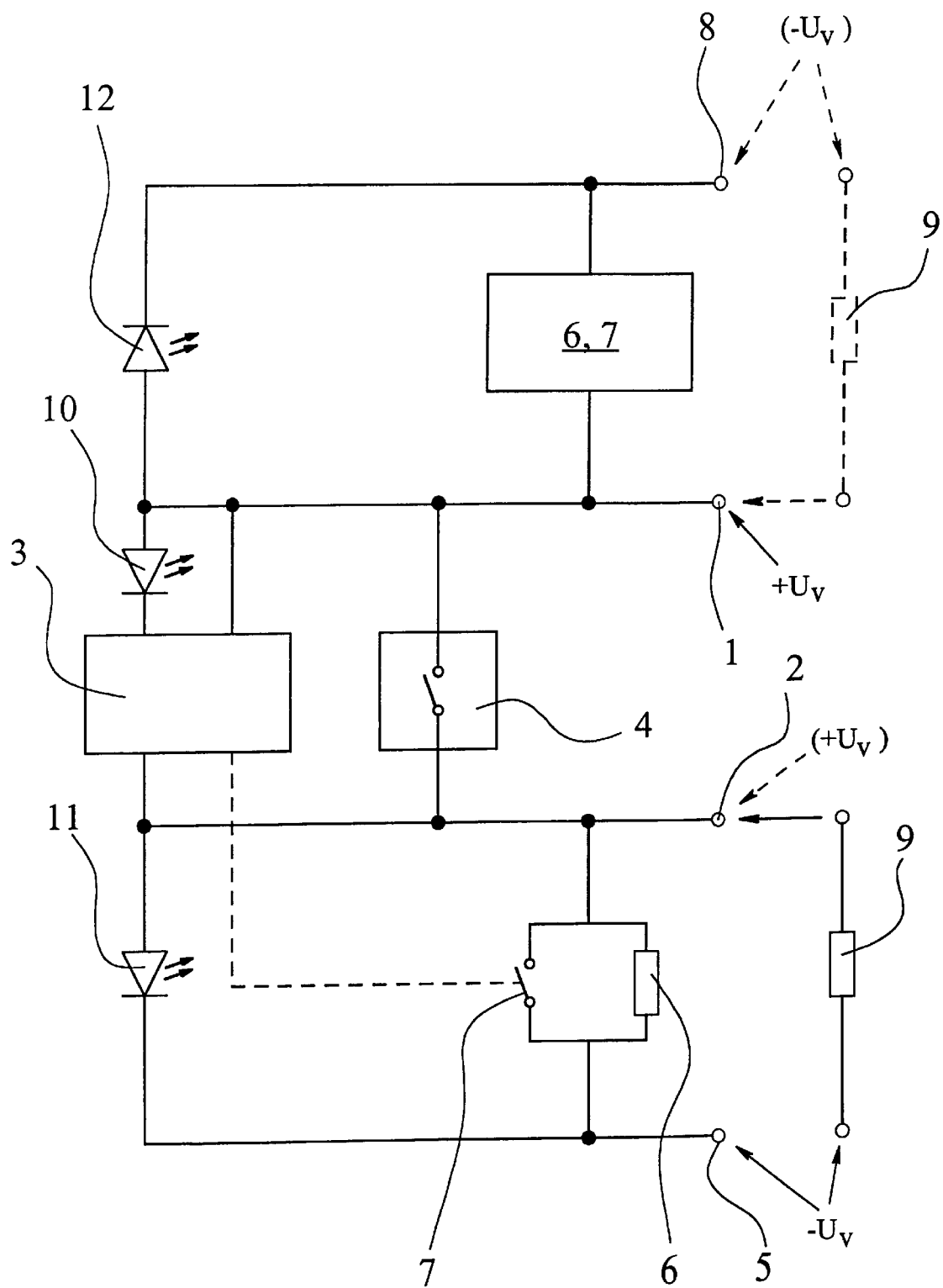
FIG. 2 is a block diagram of a first embodiment of the electronic switching device in accordance with the invention.
Figure 3:
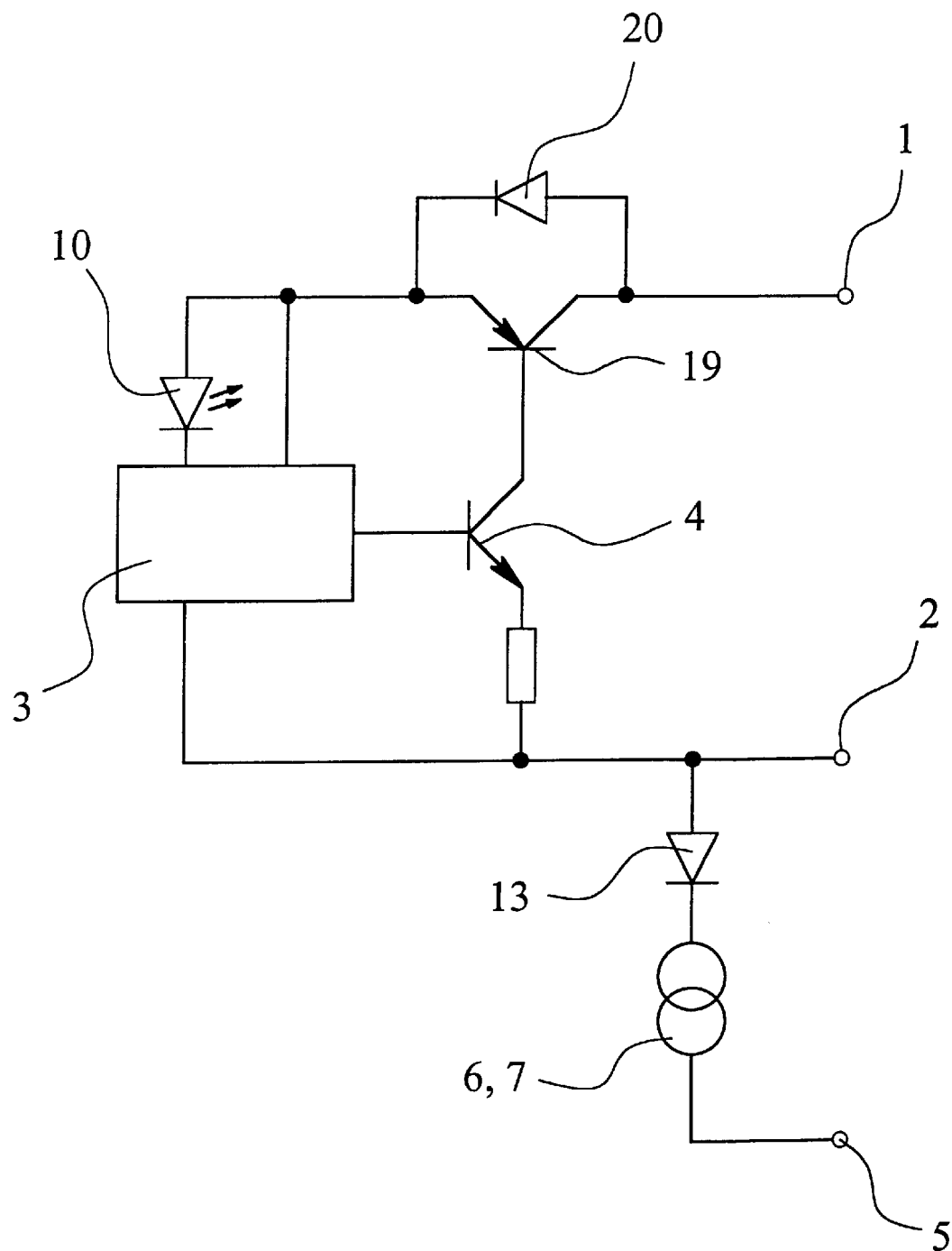
FIG. 3 is a simplified circuit diagram of a second embodiment of an electronic switching device according to the invention.

The switching devices shown in FIGS. 1 to 3, partially and partially only schematically, work without contact. They can be inductive, capacitive or optoelectronic proximity switches or flow indicators.

First of all, the switching devices shown in FIGS. 1 to 3 have a first switching device terminal 1 and a second switching device terminal 2, a sensor and evaluation circuit 3 which contains a proximity indicator (not shown) and which can be externally influenced, and an operating voltage supply circuit, (not shown), for making available the internally required operating voltage (= internal operating voltage), and an electronic switch 4 which can be controlled by the sensor and evaluation circuit 3, for example, a switching transistor. As shown by FIGS. 1 to 3, the sensor and evaluation circuit 3, on the one hand, and the electronic switch 4, on the other, are connected in parallel and to the first switching device terminal 1 and the second switching device terminal 2. In so far as the switching devices of the invention has been described to this point, it is a conventional 2-wire switching device.

According to the invention, there is a third switching device terminal 5, and between the second switching device terminal 2 and the third switching device terminal 5, there are a current rise 6, which is active in the conductive state of the switching device, and a voltage drop or limitation 7 which is active in the blocked state of the switching device.

Figure 4:
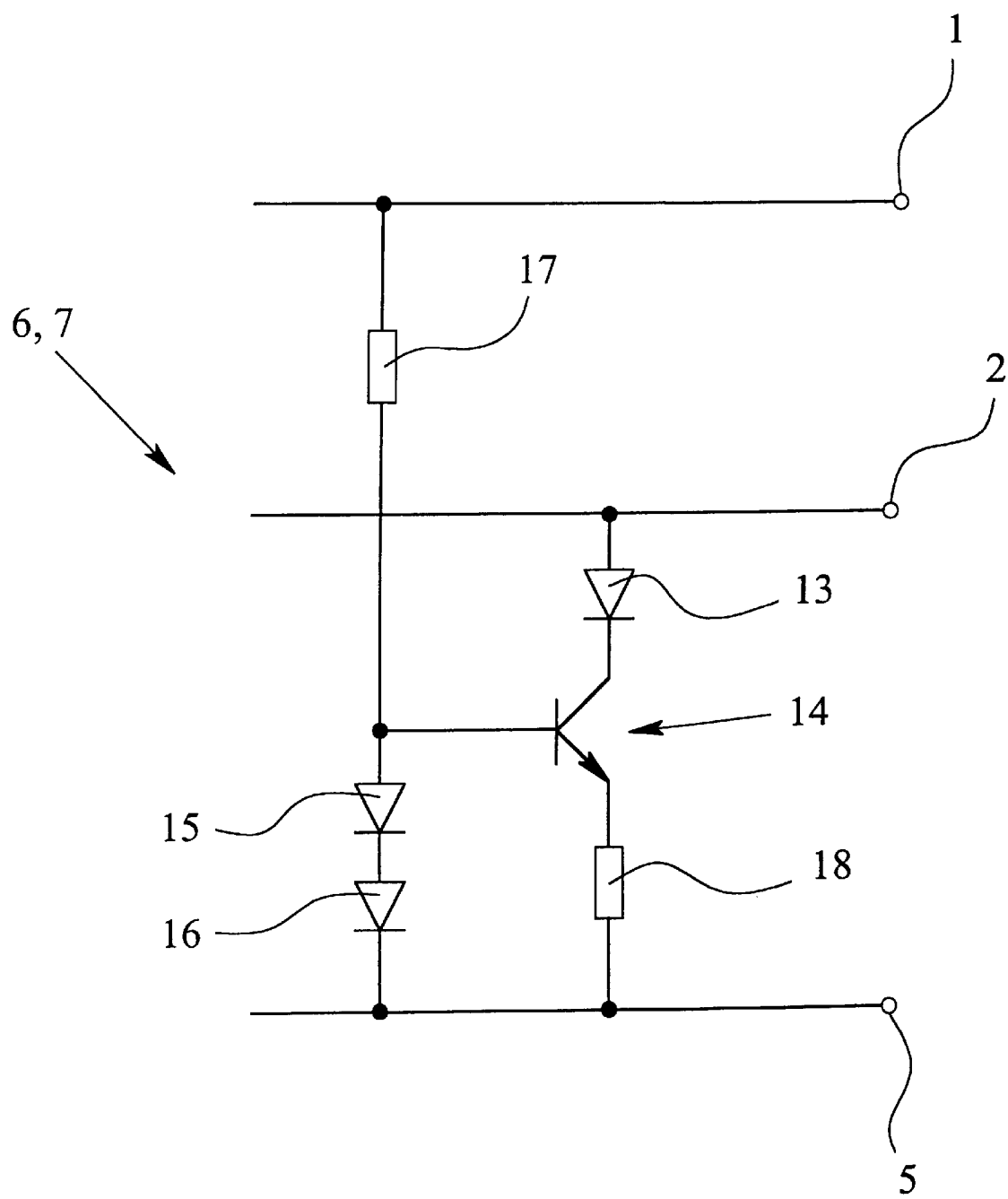
FIG. 4 is a circuit diagram of a measure which is implemented in the switching device of the invention and which is used both to increase the current and also to reduce or limit the voltage.

In the embodiment shown in FIG. 2, there is a resistor as the current rise 6, and as the voltage reduction or limitation 7, there is an electronic switch which is controlled by the sensor and evaluation circuit 3 and which is conductive in the conductive state of the switching device. Conversely, it applies to the embodiment shown in FIG. 3 that there is a constant current source as the current rise 6 and as the voltage reduction or limitation 7; FIG. 4 shows how one such constant current source can be made.

As has already been explained above, the switching device in accordance with the invention can be used, on the one hand, as a 2-wire switching device, and on the other, also as a 3-wire switching device. In 3-wire switching devices, it is distinguished between those which are plus-switching, and those which are minus-switching. But there are also switching devices, specifically 4-wire switching devices, which can therefore be used selectively as plus-switching or minus-switching. These 4-wire switching devices have a fourth switching device terminal 8, as is shown in FIG. 2.

In the following, FIG. 2 will be used to explain the possible applications of the switching device in accordance with the invention in conjunction with a load 9 which is shown only in FIG. 2.

The electronic switching device according to the invention, first of all, can be used as a normal 2-wire switching device. For this purpose, the plus pole $+U_v$ of the power supply voltage can be connected to the first switching device terminal 1 and the load 9, on the one hand, to the second switching device terminal 2 and on the other to the minus pole $-U_v$ of the power supply voltage. This is widely known prior art and does not require further explanation here.

However, the switching device in accordance with the invention can be used not only as a 2-wire switching device, as explained above, but also as a 3-wire switching device. For this reason, the plus pole $+U_v$ of the power supply voltage can be connected to the first switching device terminal 1, and the load 9 can be connected, on the one hand, to the second switching device terminal 2, and on the other, to the minus pole $-U_v$ of the power supply voltage. In addition, at this point, the minus pole $-U_v$ of the power supply voltage must be connected to the third switching device terminal 5, as is shown in FIG. 2. If, as described above, the switching device according to the invention is used as a 3-wire switching device, the measures implemented between the second switching device terminal 2 and the third switching device terminal, current rise 6 and voltage reduction or limitation 7, lead to the fact that, in the conductive state of the switching device, therefore in the electronic switch 4 which is conductively controlled by the sensor and evaluation circuit 3, the operating current which is required by the sensor and evaluation circuit 3 need not flow via the load 9, but can flow via the current rise 6, and that with a blocked switching device, the residual current which flows via the sensor and evaluation circuit 3 need not flow via the load 9, but can flow via the voltage reduction and limitation 7. As was explained above, the current rise 6, on the one hand, and the voltage reduction or limitation 7, on the other, can be made such that, in the conductive state of the switching device, the operating current which is required by the sensor and evaluation circuit 3 flows completely via the current rise 6, and in the blocked state, the residual current which flows via the sensor and evaluation circuit 3 flows completely via the voltage reduction or limitation 7. This has the consequence that the load current which flows in the conductive state of the switching device via the load 9 can be arbitrarily small, the load 9 can therefore have arbitrarily high resistance, and that, in the blocked state of the switching device, no residual current flows via the load 9.

Therefore, switching device of the invention can be used, first of all, as a 2-wire switching device with the advantage of a 2-wire switching device in which only two lines are needed and must be connected; however, where the system-induced disadvantages of a 2-wire switching device cannot be accepted, as in terms of function, essentially a normal 3-wire switching device can be used.

As already stated, FIG. 2 shows in this respect a special embodiment of a switching device according to the invention which, when it is not used as a 2-wire switching device, can be used selectively as a plus-switching, 3-wire switching device or as a minus-switching, 3-wire switching device, and consequently is made as a 4-wire switching device.

It has already been explained above how the switching device of the invention can be connected as a 3-wire switching device; the explanation given above being related to the use of the switching device as a plus-switching 3-wire switching device. How the switching device as in accordance with the invention can be connected, in particular, so that it works as a minus-switching, 3-wire switching device, for one skilled in the art, can be easily understood from FIG. 2, specifically shown there in parentheses and by a broken line.

It otherwise applies to the switching device according to the invention which is shown in FIG. 1 that there is a state-LED 10 which optically displays the state of the switching device, i.e., conductive or blocked. In the embodiment shown in FIG. 2, in addition to the state-LED 10 there are two additional state-LEDs 11, 12 which make it possible to optically recognize whether the switching device is being used as a plus-switching 3-wire switching device or as a minus-switching 3-wire switching device.

While, as explained above, in the embodiment as shown in FIG. 2, a resistor is used as the current rise 6 and an electronic switch is used as the voltage reduction or limitation 7, it applies to the embodiment which is shown in FIG. 3 that there is a constant current source both as the current rise 6 and also as the voltage reduction or limitation 7. In this embodiment, a polarization diode 13, preferably a Schottky diode, is connected upstream of the constant current source which works as the current rise 6 and voltage reduction or limitation 7.

FIG. 4 shows a specific embodiment of a constant current source which can be used as a current rise 6 and as a voltage reduction or limitation 7. This includes a transistor 14, two base diodes 15, 16, preferably Schottky diodes, a base resistor 17 and an emitter resistor 18. The base of the transistor 14 is connected via the base resistor 17 which is made to have relatively high resistance, to the first switching device terminal 1, and thus, to the positive pole +V$_v$ of the power supply voltage. The collector of the transistor 14 lies, with the interposition of the polarization diode 13, at the second switching device terminal 2. Otherwise, the base diode 16 and the emitter resistor 18 are connected to the third switching device terminal 5.

As already explained, it is recommended that the switching device in accordance with the invention be made polarized with the measures which are described in the above-mentioned German Patent Application 199 05 170. This is indicated in FIG. 3 only to the extent that an inversely operated bipolar transistor 19 is connected downstream of the first switching device terminal 1 as the polarity reversal protection element. The inversely operated bipolar transistor 19 is used both as polarity reversal protection for the sensor and evaluation circuit 3 and also for the electronic switch 4. As shown in FIG. 3, the collector-base section of the inversely operated bipolar transistor 19 is connected in series to the break distance of the electronic switch 4, the inversely operated bipolar transistor 19 can, therefore, be controlled via the electronic switch 4. Otherwise, an auxiliary diode 20 is connected in parallel to the collector-emitter section of the inversely operated bipolar transistor 19. For how the bipolar transistor 19 acts as a polarization element, for which reason the auxiliary diode 20 is provided, and as otherwise, the polarity reversal protection which is only indicated in FIG. 3 can be embodied and developed, reference is made to the contents of the above-noted German Patent Application 199 05 170 which are expressly incorporated herein.

We claim:

1. Electronic switching device comprising a first switching device terminal, a second switching device terminal, a third switching device terminal, a sensor and evaluation circuit which contains an externally influenceable proximity indicator, an operating voltage supply circuit for making available an internal operating voltage, and an electronic switch controlled by the sensor and evaluation circuit, the sensor and evaluation circuit, on the one hand, and the electronic switch, on the other, being connected essentially in parallel and to the first switching device terminal and the second switching device terminal, wherein at least one of a current rise which is active in the conductive state of the switching device and a voltage drop that is active in the blocked state of the switching device is located between the second switching device terminal and the third switching device terminal.

2. Electronic switching device as claimed in claim 1, wherein the current rise is a resistor.

3. Electronic switching device as claimed in claim 1, wherein the current rise is a constant current source.

4. Electronic switching device as claimed in claim 1, wherein the voltage drop is an electronic switch which is conductive in the conductive state of the switching device.

5. Electronic switching device as claimed in claim 3, wherein the constant current source of which the current rise is comprised is also active as the voltage drop.

6. Electronic switching device as claimed in claim 5, wherein the constant current source is active as both the current rise and the voltage drop without controlling intervention by the sensor and evaluation circuit.

7. Electronic switching device as claimed in claim 5, wherein the constant current source is a current balancing circuit with feedback between balancing transistors.

8. Electronic switching device as claimed in claim 3, wherein at least one polarity reversing protection diode is connected upstream of the constant current source.

9. Electronic switching device as claimed in claim 1, wherein an inversely operated bipolar transistor is connected in series to a switching device terminal as a polarity reversal protection element.

10. Electronic switching device as claimed in claim 9, wherein the inversely operated bipolar transistor is active both as a polarity reversal protection for the sensor and evaluation circuit and also for the electronic switch.

11. Electronic switching device as claimed in claim 9, wherein a collector-base section of the inversely operated bipolar transistor is connected in series to a break distance of the electronic switch, and the inversely operated bipolar transistor is controlled via the electronic switch.

12. Electronic switching device as claimed in claim 9, wherein an auxiliary diode is connected in parallel to a collector-emitter section of the inversely operated bipolar transistor.

13. Electronic switching device as claimed in claim 1, wherein the electronic switch is a switching transistor.

14. Electronic switching device as claimed in claim 1, wherein the electronic switching device is a proximity-type switching device.

15. Electronic switching device as claimed in claim 8, wherein said at least one polarity reversing protection diode is a Schottky diode.

* * * * *